US009880198B2

(12) United States Patent
Ao et al.

(10) Patent No.: US 9,880,198 B2
(45) Date of Patent: Jan. 30, 2018

(54) HIGH BANDWIDTH SIGNAL PROBE TIP

(71) Applicant: Lenovo Enterprise Solutions (Singapore) Pte. Ltd., Singapore (SG)

(72) Inventors: Eric R. Ao, Nepean (CA); Donald R. Dignam, Ottawa (CA); Jian Meng, Kanata (CA); Fred Roberts, Nepean (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 600 days.

(21) Appl. No.: 13/763,764

(22) Filed: Feb. 11, 2013

(65) Prior Publication Data
US 2014/0225637 A1 Aug. 14, 2014

(51) Int. Cl.
G01R 1/067 (2006.01)
G01R 31/28 (2006.01)

(52) U.S. Cl.
CPC ...... *G01R 1/06738* (2013.01); *G01R 1/06766* (2013.01); *G01R 1/06772* (2013.01); *G01R 31/2805* (2013.01)

(58) Field of Classification Search
CPC .................................................. G01R 31/02
USPC .......................................... 324/761; 439/886
See application file for complete search history.

(56) References Cited

U.S. PATENT DOCUMENTS 3,827,004 A * 7/1974 Vanden Heuvel ..... H05K 3/308
174/262
4,943,720 A * 7/1990 Jones .................... B82Y 35/00
324/755.01
5,038,252 A * 8/1991 Johnson ............... H05K 1/0263
174/251
5,188,547 A 2/1993 Dixon et al.
5,534,787 A * 7/1996 Levy ........................ 324/754.09
(Continued)

FOREIGN PATENT DOCUMENTS

CN 101666854 A * 3/2010
EP 0513992 * 4/1991 ............. G01R 1/067
(Continued)

OTHER PUBLICATIONS

IBM, "Buried Micro-Probe PCB and Package Conduit to Probe Blind or Buried Vias", IP.com Prior Art Database, IP.com No. IPCOM000185236D, Jul. 16, 2009, pp. 1-3. © IP.com, Inc.
(Continued)

*Primary Examiner* — Paresh Patel
(74) *Attorney, Agent, or Firm* — Zilka-Kotab, P.C.

(57) ABSTRACT

A high bandwidth signal probe device and a method of probing a high bandwidth signal are provided. The high bandwidth signal probe device includes a probe tip for probing a stub of a backdrilled via of a printed circuit board. The probe tip is adapted to fit in the backdrilled via. The probe tip has a length adapted to reach the stub of the backdrilled via. The probe tip is adapted to contact a plated portion of the stub of the backdrilled via. A resistive element is associated with the probe tip. The method includes inserting a probe tip of a signal probe device in the backdrilled via, placing the probe tip in contact with a plated portion of the stub of the backdrilled via, and receiving an electrical signal through a path which includes a resistive element of the probe tip of the signal probe device.

17 Claims, 7 Drawing Sheets

(56) References Cited

U.S. PATENT DOCUMENTS

| | | | | |
|---|---|---|---|---|
| 5,761,050 | A * | 6/1998 | Archer | H01R 12/585 361/744 |
| 5,823,818 | A | 10/1998 | Bell et al. | |
| 6,181,219 | B1 * | 1/2001 | Gailus | H05K 1/024 174/262 |
| 6,593,535 | B2 * | 7/2003 | Gailus | H01R 12/523 174/255 |
| 6,661,245 | B1 | 12/2003 | Reis et al. | |
| 6,696,850 | B1 | 2/2004 | Sanders | |
| 7,378,832 | B2 * | 5/2008 | Sutono | G01R 1/06772 324/754.07 |
| 7,491,069 | B1 * | 2/2009 | Di Stefano | G01R 1/0491 439/74 |
| 7,540,744 | B1 * | 6/2009 | Minich | H01R 12/585 439/65 |
| 7,815,466 | B2 * | 10/2010 | Yaghmai et al. | 439/581 |
| 7,934,962 | B2 * | 5/2011 | Hirano et al. | 439/886 |
| 8,123,572 | B2 * | 2/2012 | Sharf | H01R 12/58 439/751 |
| 8,154,316 | B2 | 4/2012 | Lagerberg et al. | |
| 2005/0010231 | A1 * | 1/2005 | Myers | A61B 17/8822 606/86 R |
| 2006/0076968 | A1 * | 4/2006 | Miyazawa et al. | 324/761 |
| 2006/0152240 | A1 | 7/2006 | Lee | |
| 2008/0217052 | A1 * | 9/2008 | Matsui | H05K 1/0268 174/266 |
| 2009/0011642 | A1 * | 1/2009 | Amleshi | H01R 12/585 439/607.05 |
| 2009/0302874 | A1 | 12/2009 | Harvey et al. | |
| 2012/0126842 | A1 | 5/2012 | Huang et al. | |
| 2012/0249174 | A1 | 10/2012 | Suzuki et al. | |
| 2013/0015870 | A1 * | 1/2013 | Nickel et al. | 324/754.03 |

FOREIGN PATENT DOCUMENTS

| | | |
|---|---|---|
| KR | 1020080114374 A | 12/2008 |
| WO | 2007137605 A1 | 6/2007 |

OTHER PUBLICATIONS

IBM, "Under-Module Signal Probe With Angulation Wires", IP.com Prior Art Database, IP.com No. IPCOM000191759D, Jan. 14, 2010, pp. 1-8. © IP.com, Inc.

Kim et al. "Signal Integrity Improvements of a MEMS Probe Card Using Back-Drilling and Equalizing Techniques", IEEE Transactions on Instrumentation and Measurement, vol. 60, Issue 3 Published Mar. 2011, pp. 872-879. © 2010 IEEE.

* cited by examiner

HIGH BANDWIDTH SIGNAL PROBE TIP

TECHNICAL FIELD

This disclosure relates generally to probing circuit boards and, more particularly, relates to signal probes for probing circuit boards.

BACKGROUND

Signal probes may be used for oscilloscopes, logic analyzers, and other test equipment for probing printed circuit boards. Vias are typically placed on top or bottom of a printed circuit board to which traces may be connected. A stub via is a common via configuration found on a printed circuit board (PCB). Backdrilling a stub via may occur on a PCB to reduce stub length for high bandwidth signals in order to reduce potentially negative side effects of via stubs such as signal reflection.

SUMMARY

In an embodiment, this disclosure relates to a high bandwidth signal probe device. The high bandwidth signal probe device includes a probe tip for probing a stub of a backdrilled via of a printed circuit board. The probe tip may be adapted to fit in the backdrilled via. The probe tip may have a length adapted to reach the stub of the backdrilled via. The probe tip may be adapted to contact a plated portion of the stub of the backdrilled via. A resistive element may be associated with the probe tip.

In an embodiment, this disclosure relates to a method of probing a high bandwidth signal. In particular, this disclosure relates to a method of probing a high bandwidth signal of a stub of a backdrilled via of a printed circuit board. The method includes inserting a probe tip of a signal probe device in the backdrilled via. The method includes placing the probe tip in contact with a plated portion of the stub of the backdrilled via. The method includes receiving an electrical signal through a path which includes a resistive element of the probe tip of the signal probe device.

DETAILED DESCRIPTION

Backdrilling may remove a portion of a stub of a plated through hole (PTH) via. One purpose of backdrilling is to reduce the length of the stub which improves high speed signal characteristics. Longer stubs may act as capacitive stubs which degrade signals as transmission speeds increase. Shorter stubs may reduce potentially negative side effects such as signal reflection. After the backdrilling process, probe points on surface layers may not exist in order to visually verify the signal integrity of a high bandwidth signal. Potential probe points recessed in a backdrilled via may not be able to be reached by a typical signal probe device. Even if reached, sufficient contact to gain an accurate reading from a plated portion of a stub of the backdrilled via may not occur by a typical signal probe device.

Aspects of the disclosure may include a probe tip of a signal probe device to probe signals of backdrilled vias. The signals may be differential signals. In embodiments, a stub of a backdrilled via may include a plated portion. In embodiments, a stub of a backdrilled via may include a conductive material. The conductive material may be metal. The metal may form a shape of a ring. The metal ring may be a copper ring or another metal. The copper ring may be relatively thin. The probe tip may make sufficient contact with the plated portion, metal ring, or press fit pins of a press fit connector to probe a signal that may supply an accurate signal reading.

Aspects of the disclosure may include a probe tip enabling the ability to visually verify the signal integrity of high speed signals of backdrilled vias. Signal waveforms may be captured, inspected, or compared with standard masks. Aspects of the disclosure may reduce side effects of the stub of the backdrilled via. Aspects of the disclosure may include a resistive element such as a resistive material or an embedded resistor. Aspects of the disclosure may increase the accuracy of measurements of a high bandwidth signal. Aspects of the disclosure may allow for a pitch to be adjusted between positive and negative pins of a signal probe device which is a differential signal probe device. Aspects of the disclosure may allow the probe tip to fit backdrilled vias of varying diameters and depth. Aspects of the disclosure may include the probe tip having a length adapted to reach the stub of the backdrilled via.

Figure 1:
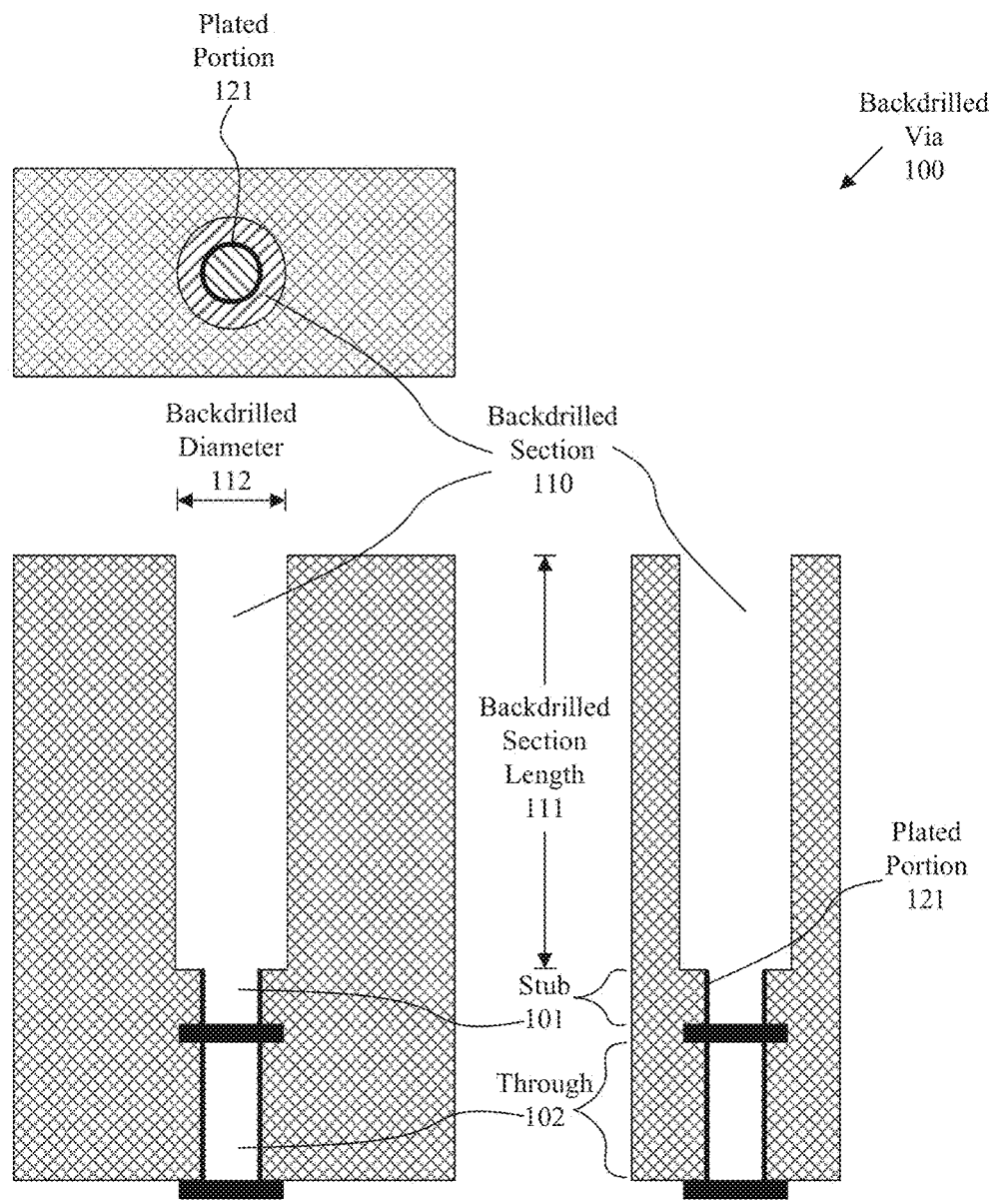
FIG. 1 illustrates a portion of a printed circuit board including a backdrilled via according to an embodiment.

FIG. 1 illustrates a portion of a printed circuit board including a backdrilled via 100 according to an embodiment. The printed circuit board may be adapted to have a signal frequency greater than 2.5 gigahertz on at least some signal paths, although other signal frequencies are contemplated. The backdrilled via 100 may be a plated through hole (PTH) via. In an embodiment, the backdrilled via 100 may include a through 102. The through 102 may be adapted to carry a signal. The backdrilled via 100 may include a stub 101. The stub 101 may be an excess portion of a PTH via. The stub 101 may have been backdrilled down to size as depicted.

The stub 101 may include a plated portion 121. The plated portion 121 may be adapted to conduct a signal. The plated portion 121 may be part of a metal ring. The metal ring may be a copper ring which may be thin. The plated portion 121 may be configured such that it may carry a reflection of the signal of the through 102. The plated portion 121 may be able to be probed to measure, capture, or characterize the signal.

The backdrilled via 100 may include a backdrilled section 110. The backdrilled section 110 may have contained a portion of a PTH via before being backdrilled down to the stub 101. The backdrilled section 110 may have a backdrilled section length 111 and a backdrilled diameter 112. The backdrilled section length 111 may be greater than the backdrilled diameter 112. In effect, the backdrilled section 110 may be similar to a cylindrical hole. Other possibilities are considered, including variations in backdrilled section length 111 or backdrilled diameter 112.

Figure 2:
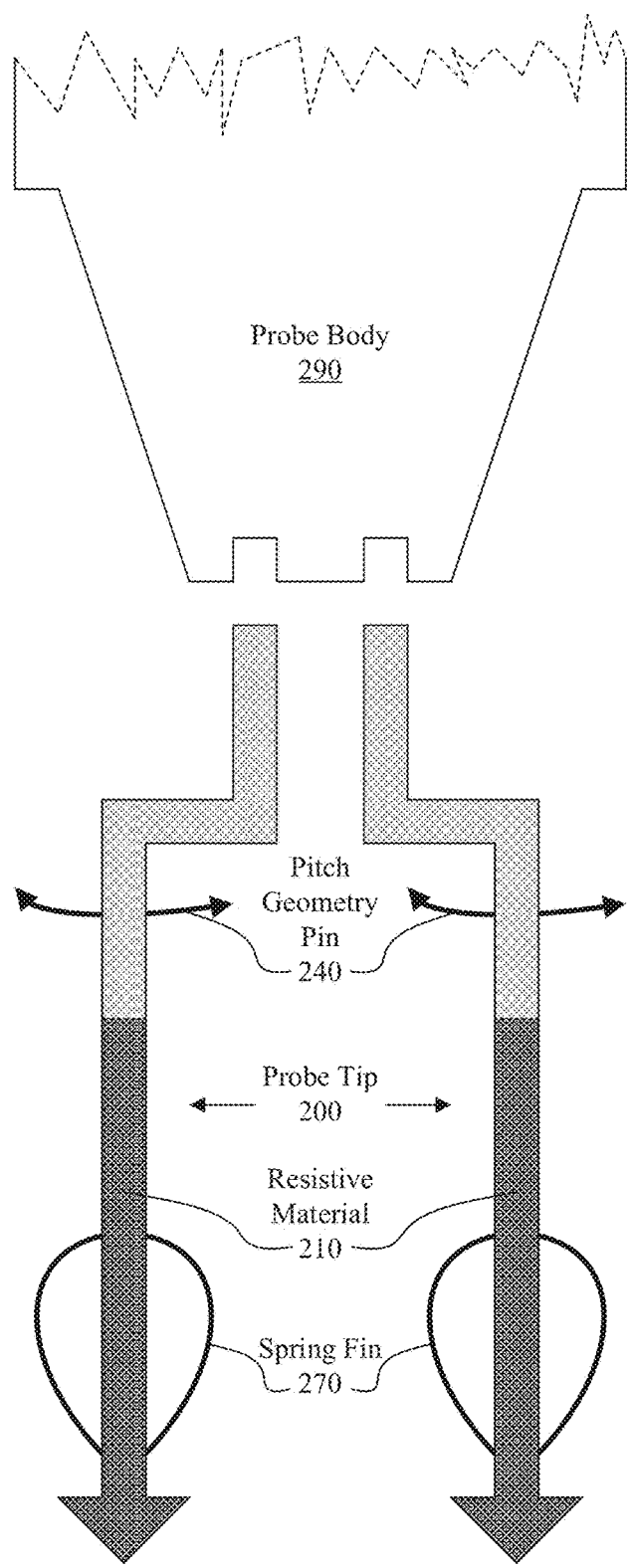
FIG. 2 illustrates a probe tip according to an embodiment.

FIG. 2 illustrates a probe tip 200 according to an embodiment. Aspects of the probe tip 200 may reduce side effects of a stub of a backdrilled via. The probe tip 200 may be adapted to fit with a probe body 290 associated with the probe tip 200. The probe tip 200 may be adapted to be replaceable relative to the probe body 290. In other embodiments, the probe tip 200 and the probe body 290 may be inseparable. In embodiments, the probe tip 200 may be a differential pair with another probe tip. The probe tip 200 may be adapted to fit in the backdrilled via 100. The probe tip 200 may be of a length adapted to reach the stub 101 of the backdrilled via 100. The length of the probe tip 200 may be at least as long as the backdrilled section length 111.

The probe tip 200 may be adapted to contact the plated portion 121 of the stub 101 of the backdrilled via 100. The probe tip 200 may be able to receive an electrical signal through a path. Electrical signals may include differential signals, although other signals are contemplated. The path may include plated portion 121 of the stub 101 of the backdrilled via 100. The probe tip 200 may enable measuring a waveform of the electrical signal. The probe tip 200 may enable visually verifying the integrity of the electrical signal.

In embodiments, the probe tip 200 may be associated with a pitch geometry pin 240. The pitch geometry pin 240 may be adapted to adjust a pitch geometry of the probe tip 200. Such adjustment may assist in adapting the probe tip 200 to fit in a via such as a backdrilled via 100. In embodiments, the probe tip 200 may be associated with a spring fin 270. The spring fin 270 may assist in adapting the probe tip 200 to fit in a via such as a backdrilled via 100. The spring fin 270 may assist in adapting the probe tip 200 to be centered in a via such as a backdrilled via 100. The spring fin 270 may assist in adapting the probe tip 200 to contact a plated portion 121 of a stub 101 of a via such as a backdrilled via 100. In embodiments, the spring fin 270 may be a soft spring fin associated with the probe tip 200. In embodiments, the number of spring fins 270 or soft spring fins associated with the probe tip 200 may vary. Two, three, or four spring fins 270 or soft spring fins are contemplated but other possibilities are considered. In embodiments, the location of the spring fin 270 relative to the probe tip 200 may vary.

A resistive element may be associated with the probe tip 200. The resistive element may introduce resistance to the probe tip 200. The resistive element may be adapted to increase impedance to assist in measuring the electrical signal. In embodiments, greater than fifty ohms of resistance may be introduced. In some embodiments, hundreds of ohms of resistance may be introduced. The resistive element may be located on the probe tip 200 nearer to a first end which contacts the plated portion 121 of the stub 101 of the backdrilled via 100 than a second end which may fit in the probe body 290 associated with the probe tip 200. The resistive element may be part of the probe tip 200. The resistive element may be a resistive material 210. At least a portion of the probe tip 200 may be made up of the resistive material 210. The resistive material 210 may be carbon resistive material. Other possibilities are considered, such as an oxide as a resistive material.

Figure 3:
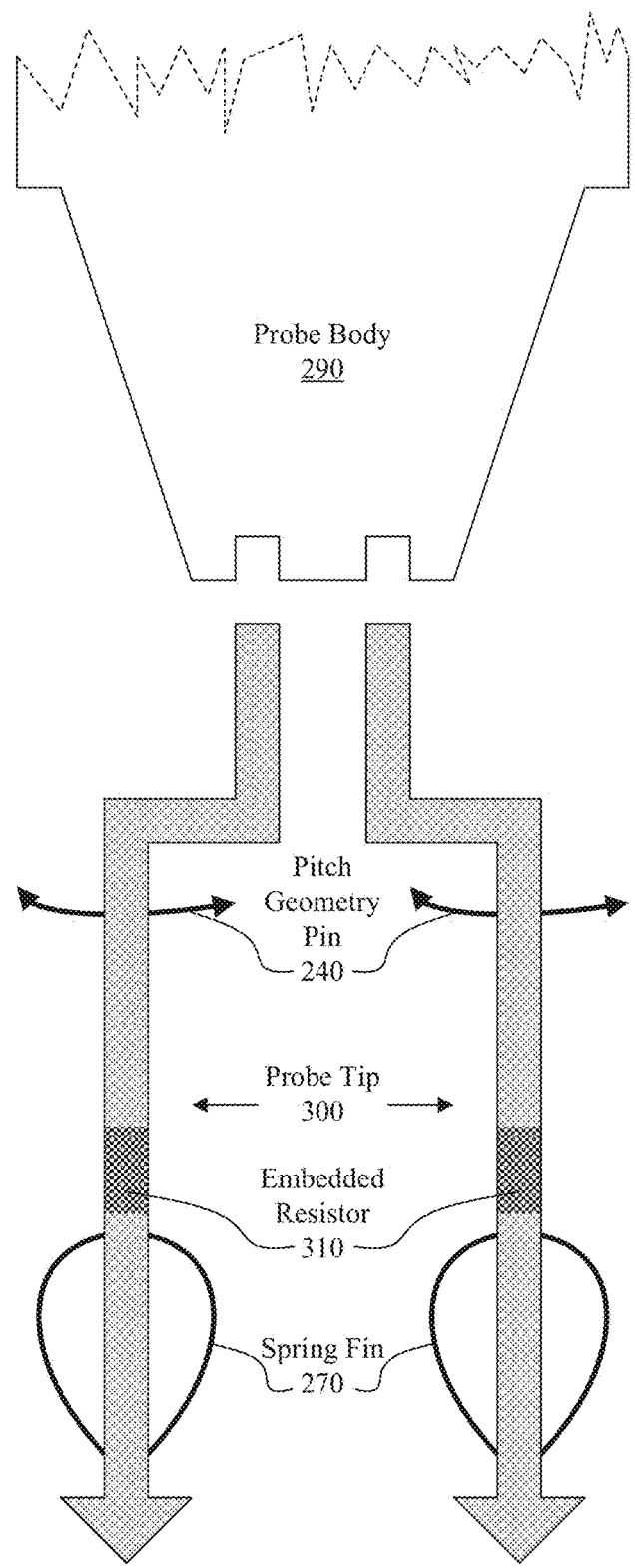
FIG. 3 illustrates a probe tip according to an embodiment.

FIG. 3 illustrates a probe tip 300 according to an embodiment. Aspects of the probe tip 300 may be similar or the same as the probe tip 200. Aspects of the probe tip 300 may reduce side effects of a stub of a backdrilled via. The probe tip 300 may be adapted to fit with a probe body 290 associated with the probe tip 300. The probe tip 300 may be adapted to be replaceable relative to the probe body 290. In other embodiments, the probe tip 300 and the probe body 290 may be inseparable. In embodiments, the probe tip 300 may be a differential pair with another probe tip. The probe tip 300 may be adapted to fit in the backdrilled via 100. The probe tip 300 may be of a length adapted to reach the stub 101 of the backdrilled via 100. The length of the probe tip 300 may be at least as long as the backdrilled section length 111.

The probe tip 300 may be adapted to contact the plated portion 121 of the stub 101 of the backdrilled via 100. The probe tip 300 may be able to receive an electrical signal through a path. Electrical signals may include differential signals, although other signals are contemplated. The path may include plated portion 121 of the stub 101 of the backdrilled via 100. The probe tip 300 may enable measuring a waveform of the electrical signal. The probe tip 300 may enable visually verifying the integrity of the electrical signal.

In embodiments, the probe tip 300 may be associated with a pitch geometry pin 240. The pitch geometry pin 240 may be adapted to adjust a pitch geometry of the probe tip 300. Such adjustment may assist in adapting the probe tip 300 to fit in a via such as a backdrilled via 100. In embodiments, the probe tip 300 may be associated with a spring fin 270. The spring fin 270 may assist in adapting the probe tip 300 to fit in a via such as a backdrilled via 100. The spring fin 270 may assist in adapting the probe tip 300 to be centered in a via such as a backdrilled via 100. The spring fin 270 may assist in adapting the probe tip 300 to contact a plated portion 121 of a stub 101 of a via such as a backdrilled via 100. In embodiments, the spring fin 270 may be a soft spring fin associated with the probe tip 300. In embodiments, the number of spring fins 270 or soft spring fins associated with the probe tip 300 may vary. Two, three, or four spring fins 270 or soft spring fins are contemplated but other possibilities are considered. In embodiments, the location of the spring fin 270 relative to the probe tip 300 may vary.

A resistive element may be associated with the probe tip 300. The resistive element may introduce resistance to the probe tip 300. The resistive element may be adapted to increase impedance to assist in measuring the electrical signal. In embodiments, greater than fifty ohms of resistance may be introduced. In some embodiments, hundreds of ohms of resistance may be introduced. The resistive element may be located on the probe tip 300 nearer to a first end which contacts the plated portion 121 of the stub 101 of the backdrilled via 100 than a second end which may fit in the probe body 290 associated with the probe tip 300. The resistive element may be part of the probe tip 300. The resistive element may be an embedded resistor 310. Other possibilities are considered, such as a different type of electrical component.

Figure 4:
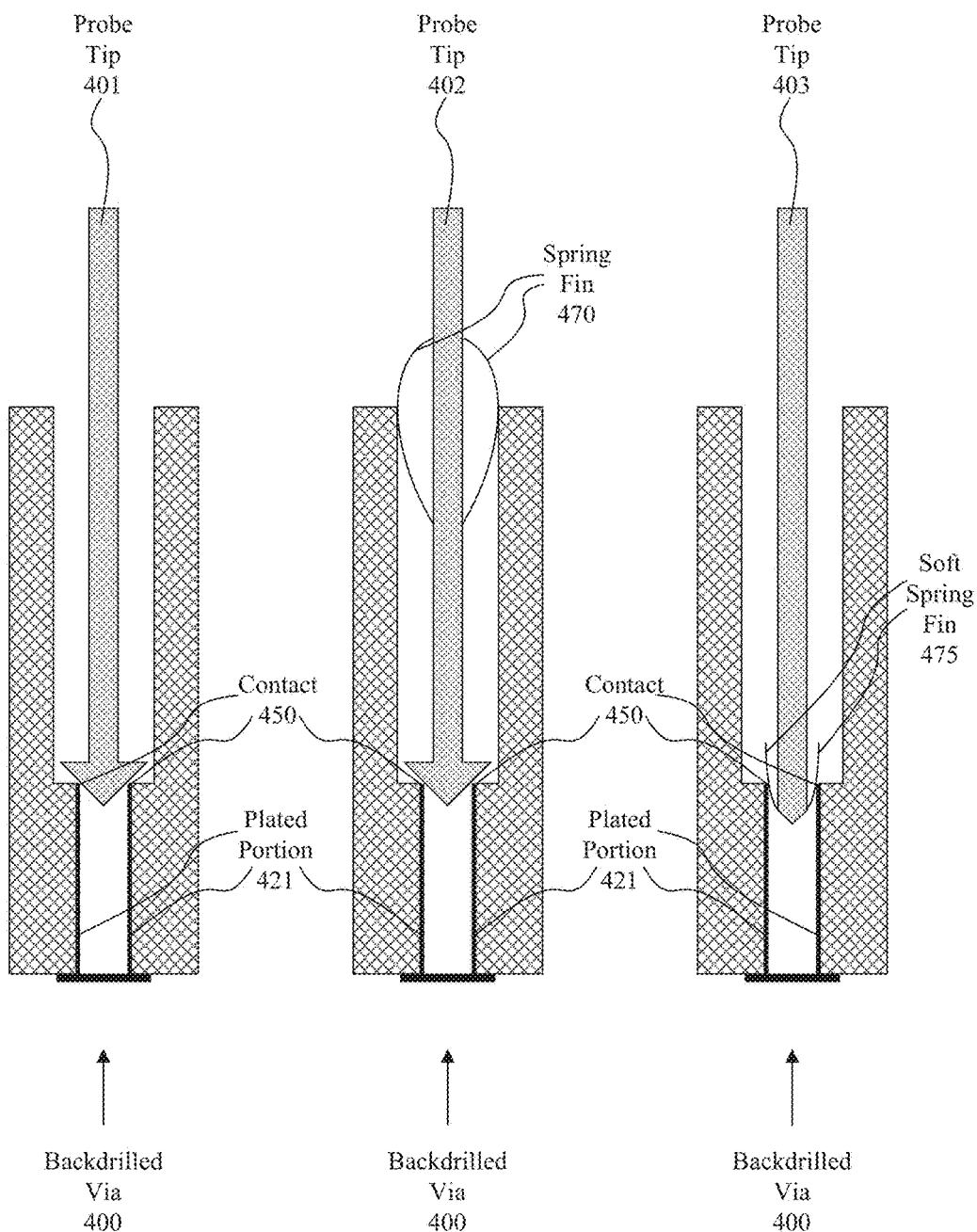
FIG. 4 illustrates probe tips adapted to contact a plated portion of a stub of a backdrilled via according to embodiments.

FIG. 4 illustrates probe tips adapted to contact a plated portion 421 of a stub of a backdrilled via 400 according to embodiments. The backdrilled via 400 may be considered a "regular" backdrilled via. Plated metal such as copper may be in a ring shape and may be probed. The backdrilled via 400 may include the plated portion 421 that may contact a probe tip 401 at a contact 450. The backdrilled via 400 may include the plated portion 421 that may contact a probe tip 402 at a contact 450. Probe tip 402 may be similar to probe tip 401 with an addition of a spring fin 470. The backdrilled via 400 may include the plated portion 421 that may contact a probe tip 403 at a contact 450. Probe tip 403 may be similar to probe tip 401 and associated with a soft spring fin 475 adapted to contact the contact 450. The soft spring fin 475 may assist in adapting the probe tip 403 to fit in a via such as a backdrilled via 400. The soft spring fin 475 may assist in adapting the probe tip 403 to be centered in a via such as a backdrilled via 400. The soft spring fin 475 may assist in adapting the probe tip 403 to contact a plated portion 421 of the backdrilled via 400. Other possible configurations of probe tips providing contact with the plated portion are considered.

Figure 5:
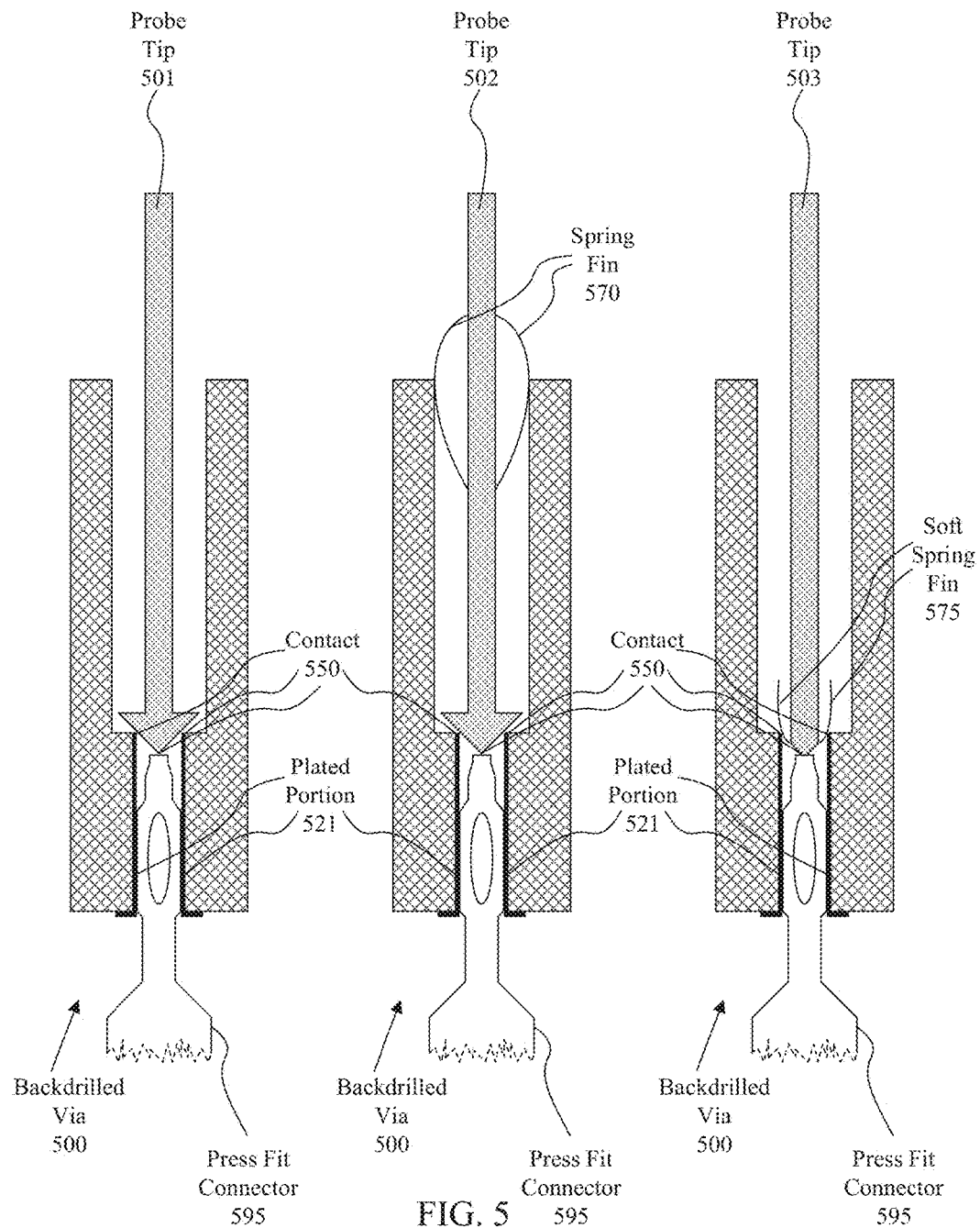
FIG. 5 illustrates probe tips adapted to contact a plated portion of a stub of a backdrilled via or a press fit connector of a backdrilled via according to embodiments.

FIG. 5 illustrates probe tips adapted to contact a plated portion 521 of a stub of a backdrilled via 500 or a press fit connector 595 of a backdrilled via 500 according to embodiments. The backdrilled via 500 may be considered a backdrilled via with a press fit connector 595. The backdrilled via 500 with the press fit connector 595 may include press fit pins in the plated portion 521 that may be probed and may include plated metal such as copper that may be in a ring shape and may be probed. The backdrilled via 500 may include the plated portion 521 or the press fit connector 595 that may contact a probe tip 501 at a contact 550. The backdrilled via 500 may include the plated portion 521 or the press fit connector 595 that may contact a probe tip 502 at a contact 550. Probe tip 502 may be similar to probe tip 501 with an addition of a spring fin 570. The backdrilled via 500 may include the plated portion 521 or the press fit connector 595 that may contact a probe tip 503 at a contact 550. Probe tip 503 may be similar to probe tip 501 with a soft spring fin 575, similar to soft spring fin 475, contacting the contact 550 of the plated portion 521. Other possible probe tips that provide contact with a press fit connector are considered.

Figure 6:
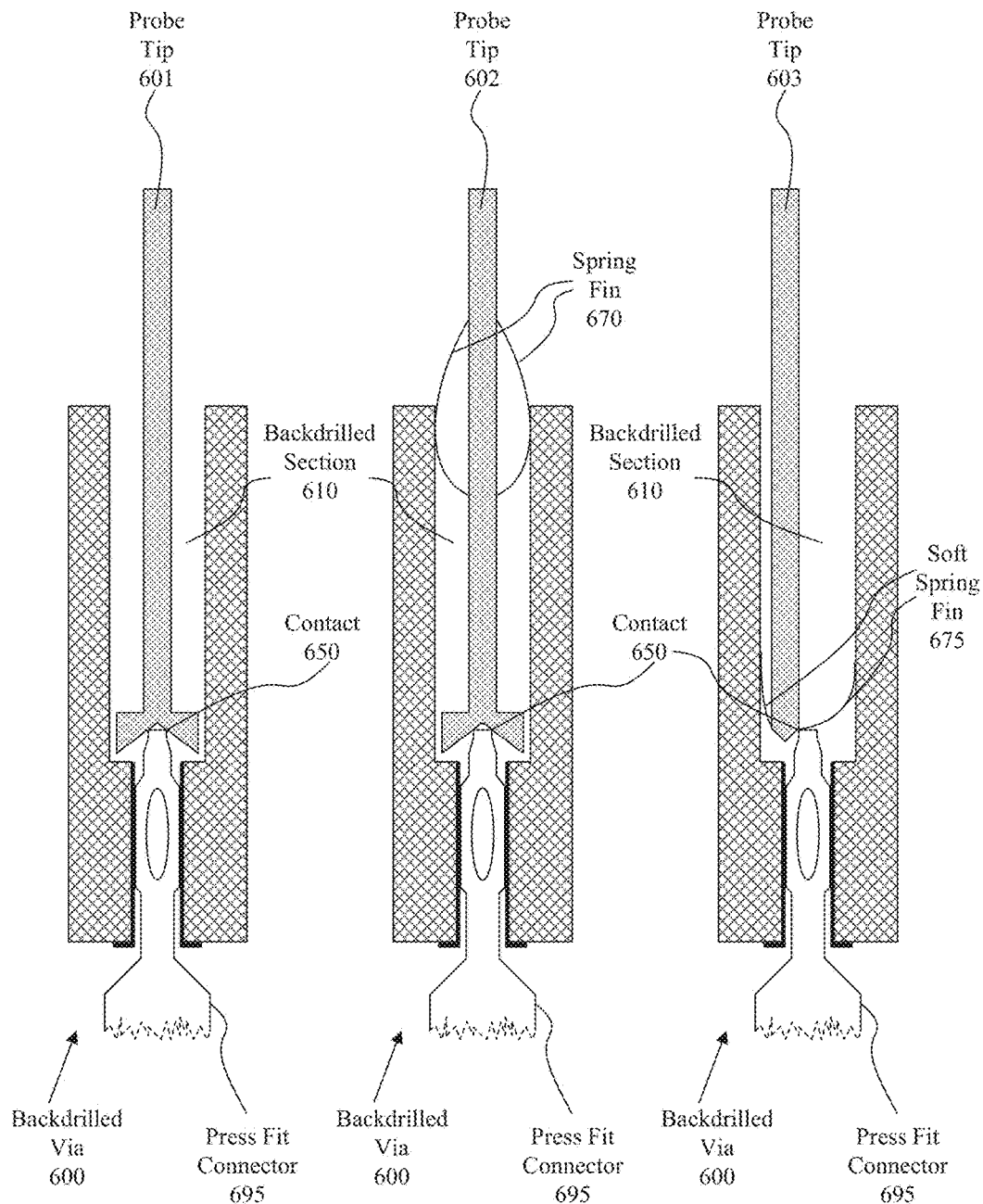
FIG. 6 illustrates probe tips adapted to contact a press fit connector of a backdrilled via according to embodiments.

FIG. 6 illustrates probe tips adapted to contact a press fit connector 695 of a backdrilled via 600 according to embodiments. The backdrilled via 600 may be considered a backdrilled via with a press fit connector 695. The backdrilled via 600 with the press fit connector 695 may include press fit pins in a backdrilled section 610 that may be probed. The backdrilled via 600 may include the press fit connector 695 that may contact a probe tip 601 at a contact 650. The backdrilled via 600 may include the press fit connector 695 that may contact a probe tip 602 at a contact 650. Probe tip 602 may be similar to probe tip 601 with an addition of a spring fin 670. The backdrilled via 600 may include the press fit connector 695 that may contact a probe tip 603 at a contact 650. Probe tip 603 may be similar to probe tip 601 with a soft spring fin 675, similar to soft spring fins 475, 575, contacting the contact 650 of the press fit connector 695. Other possible probe tips that provide contact with a press fit connector that extends into a backdrilled section are considered.

Figure 7:
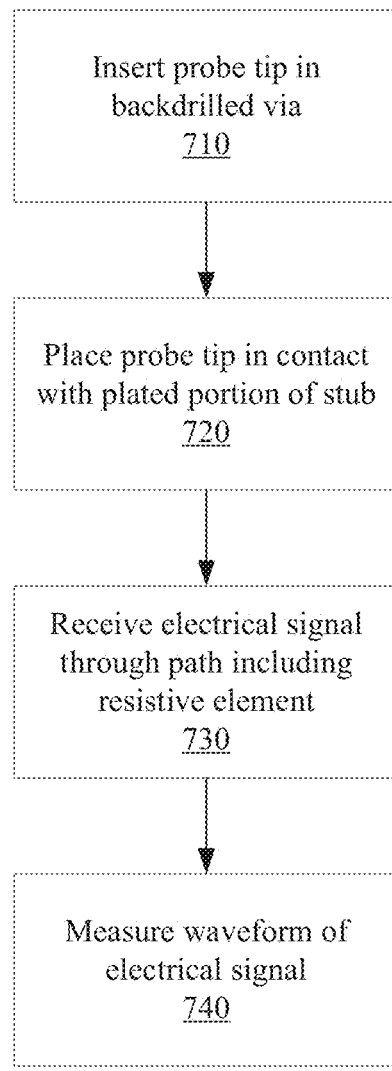
FIG. 7 is a flow chart showing an operation to probe a high bandwidth signal of a stub of a backdrilled via of a printed circuit board according to an embodiment.

FIG. 7 is a flow chart showing an operation 700 to probe a high bandwidth signal of a stub of a backdrilled via of a printed circuit board according to an embodiment. The printed circuit board may be adapted to have a signal frequency greater than 2.5 gigahertz on at least some signal paths, although other signal frequencies are contemplated. Aspects of the operation 700 may reduce side effects of the stub of the backdrilled via. A probe tip of a signal probe device may be inserted in the backdrilled via at block 710. The probe tip may be adapted to fit in the backdrilled via. The probe tip may be of a length adapted to reach the stub of the backdrilled via. The length of the probe tip may be at least as long as a backdrilled section length. A pitch geometry pin may be adapted to adjust a pitch geometry of the probe tip. Such adjustment may assist in adapting the probe tip to fit in a the backdrilled via. In embodiments, the probe tip may be associated with a spring fin. The spring fin may assist in adapting the probe tip to fit in the backdrilled via.

In embodiments, the stub of the backdrilled via may include a plated portion. The probe tip may be placed in contact with the plated portion of the stub of the backdrilled via at block 720. In embodiments, the stub of the backdrilled via may include a metal ring. The metal ring may be a copper ring. The copper ring may be thin. The probe tip may make sufficient contact with the plated portion, metal ring, or press fit pins of a press fit connector to probe a signal that may supply an accurate signal reading.

An electrical signal may be received through a path which includes a resistive element of the probe tip of the signal probe device at block 730. Electrical signals may include differential signals. In embodiments, greater than fifty ohms of resistance may be introduced. In other embodiment, hundreds of ohms of resistance may be introduced. The resistive element may be a resistive material. At least a portion of the probe tip may be made of the resistive material. In an embodiment, the resistive material may be a carbon resistive material. In embodiments, the resistive element may be an embedded resistor. The resistive element may be adapted to increase impedance.

In an embodiment, a waveform of the electrical signal may be measured at block 740. Signal waveforms may be captured, inspected, or compared with standard masks. Increasing impedance may assist in measuring the electrical signal. In an embodiment, the integrity of the electrical signal may be visually verified. The probe tip may make sufficient contact with the plated portion, metal ring, or press fit pins of a press fit connector to probe the electrical signal to supply an accurate signal reading. In addition to embodiments described above, other embodiments having fewer steps, more steps, or different steps are contemplated. Also, some embodiments may perform some or all of the steps in FIG. 7 in a different order.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

What is claimed is:

1. A signal probe device, comprising:
   a probe tip having a length for reaching a stub of a backdrilled via of a printed circuit board, where:
   the stub includes a plated portion of the backdrilled via that includes metal in a shape of a ring,
   the backdrilled via includes a backdrilled section separate from the stub where a portion of the stub has been removed to create a cylindrical hole, and
   the probe tip has an end portion for contacting the stub of the backdrilled via by contacting the metal in the shape of the ring in response to the probe tip being inserted into the backdrilled section of the backdrilled via; and
   a plurality of distinct spring fins coupled to an outer surface of the probe tip behind the end portion of the probe tip for contacting the backdrilled section of the backdrilled via, thereby centering the end portion of the probe tip within the backdrilled via of the printed circuit board, in response to the probe tip being inserted into the backdrilled section of the backdrilled via such that the end portion of the probe tip contacts the plated portion of the stub of the backdrilled via;

wherein the probe tip includes an embedded resistor that increases an impedance of the probe tip.

2. The device of claim 1, wherein:
the embedded resistor of the probe tip introduces at least 50 ohms of resistance,
the probe tip is replaceable relative to a probe body of the probe tip, and
the probe tip is for contacting both the plated portion of the stub as well as a press fit connector installed in the backdrilled via.

3. The device of claim 1, wherein backdrilled section has a backdrilled section length and a backdrilled diameter, and the backdrilled section length is greater than the backdrilled diameter.

4. The device of claim 1, wherein the probe tip is further configured to contact a press fit connector installed in the backdrilled via.

5. The device of claim 4, wherein the press fit connector has a pin extending into the backdrilled section of the backdrilled via.

6. The device of claim 1, wherein the probe tip is replaceable relative to a probe body associated with the probe tip.

7. The device of claim 1, wherein the probe tip further includes a pin.

8. The device of claim 1, wherein the printed circuit board is configured to have a signal frequency greater than 2.5 gigahertz.

9. A signal probe device, comprising:
a probe tip having a length for reaching a stub of a backdrilled via of a printed circuit board, where:
the stub includes a plated portion of the backdrilled via that includes metal in a shape of a ring,
the backdrilled via includes a backdrilled section separate from the stub where a portion of the stub has been removed to create a cylindrical hole,
the probe tip is replaceable relative to a probe body associated with the probe tip, and
the probe tip has an end portion for contacting the stub of the backdrilled via by contacting the metal in the shape of the ring in response to the probe tip being inserted into the backdrilled section of the backdrilled via; and
a plurality of distinct spring fins coupled to an outer surface of the probe tip behind the end portion of the probe tip for contacting the backdrilled section of the backdrilled via, thereby centering the end portion of the probe tip within the backdrilled via of the printed circuit board, in response to the probe tip being inserted into the backdrilled section of the backdrilled via such that the end portion of the probe tip contacts the plated portion of the stub of the backdrilled via;
wherein at least a portion of the probe tip is made of a carbon resistive material that increases an impedance of the probe tip, where the carbon resistive material introduces at least 50 ohms of resistance, and where the carbon resistive material is located nearer to the end portion of the probe tip which contacts the plated portion of the stub than a second end of the probe tip which fits in the probe body.

10. The device of claim 9, wherein the printed circuit board is configured to have a signal frequency greater than 2.5 gigahertz.

11. The device of claim 9, wherein the probe tip further includes a pin.

12. A method of probing a signal of a stub of a backdrilled via of a printed circuit board, comprising:
inserting a probe tip of the signal probe device in the backdrilled via, where:
the stub includes a plated portion of the backdrilled via that includes metal in a shape of a ring,
the backdrilled via includes a backdrilled section separate from the stub where a portion of the stub has been removed to create a cylindrical hole, and
the probe tip has an end portion that contacts the stub of the backdrilled via by contacting the metal in the shape of the ring in response to the probe tip being inserted into the backdrilled section of the backdrilled via;
centering an end portion of the probe tip of a signal probe device within the backdrilled via of the printed circuit board in response to the probe tip being inserted into the backdrilled section of the backdrilled via, such that the end portion of the probe tip contacts a plated portion of the stub in the backdrilled via, utilizing a plurality of distinct spring fins that are coupled to an outer surface behind the end portion of the probe tip that contact the backdrilled section of the backdrilled via; and
receiving an electrical signal by the probe tip;
wherein the probe tip includes an embedded resistor that increases an impedance of the probe tip.

13. The method of claim 12, wherein the embedded resistor is configured to increase the impedance to assist in measuring the electrical signal.

14. The method of claim 12, wherein:
the embedded resistor introduces at least 50 ohms of resistance,
the probe tip is replaceable relative to a probe body of the probe tip, and
the probe tip is for contacting both the plated portion of the stub as well as a press fit connector installed in the backdrilled via.

15. The method of claim 12, wherein the printed circuit board is configured to have a signal frequency greater than 2.5 gigahertz.

16. The method of claim 12, further comprising measuring a waveform of the electrical signal.

17. The device of claim 1, wherein the probe tip is for contacting both the plated portion of the stub, as well as a press fit connector installed in the backdrilled via.

* * * * *